(12) United States Patent
Choi

(10) Patent No.: US 7,491,591 B2
(45) Date of Patent: Feb. 17, 2009

(54) THIN FILM TRANSISTOR HAVING LDD STRUCTURE

(75) Inventor: Kyu-Hwan Choi, Seongnam-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 11/768,332

(22) Filed: Jun. 26, 2007

(65) Prior Publication Data

US 2007/0249108 A1 Oct. 25, 2007

Related U.S. Application Data

(62) Division of application No. 11/038,031, filed on Jan. 21, 2005, now Pat. No. 7,247,883.

(30) Foreign Application Priority Data

Feb. 12, 2004 (KR) .................. 10-2004-0009378

(51) Int. Cl.
*H01L 21/00* (2006.01)
(52) U.S. Cl. .................. 438/163; 257/E21.435
(58) Field of Classification Search ............... 438/163; 257/E21.435
See application file for complete search history.

(56) References Cited

U.S. PATENT DOCUMENTS 5,698,882 A 12/1997 Park 6,127,211 A 10/2000 Hirao et al.
6,833,313 B2 12/2004 Hayakawa
7,416,927 B2 * 8/2008 Gottsche et al. ............. 438/154
2002/0074550 A1 6/2002 Itoga

FOREIGN PATENT DOCUMENTS

| CN | 1213849 | 4/1999 |
|---|---|---|
| CN | 1375735 | 10/2002 |
| CN | 1389600 | 1/2003 |
| JP | 10-256557 | 9/1998 |
| JP | 2002-185008 | 6/2002 |
| KR | 10-2001-0039227 | 5/2001 |
| KR | 10-2002-0050085 | 6/2002 |

OTHER PUBLICATIONS

Chinese Office Action mailed May 30, 2008.

* cited by examiner

*Primary Examiner*—Charles D. Garber
*Assistant Examiner*—Stanetta D Isaac
(74) *Attorney, Agent, or Firm*—H.C. Park & Associates, PLC

(57) ABSTRACT

A thin film transistor having a LDD structure that may improve its channel reliability and output characteristics. A semiconductor layer comprises source/drain regions, a channel region positioned between the source/drain regions, and an LDD region positioned between the channel region and a source/drain region, wherein a projected range of ions doped on the semiconductor layer extends to a first depth from the surface of the semiconductor layer in the LDD region.

5 Claims, 4 Drawing Sheets

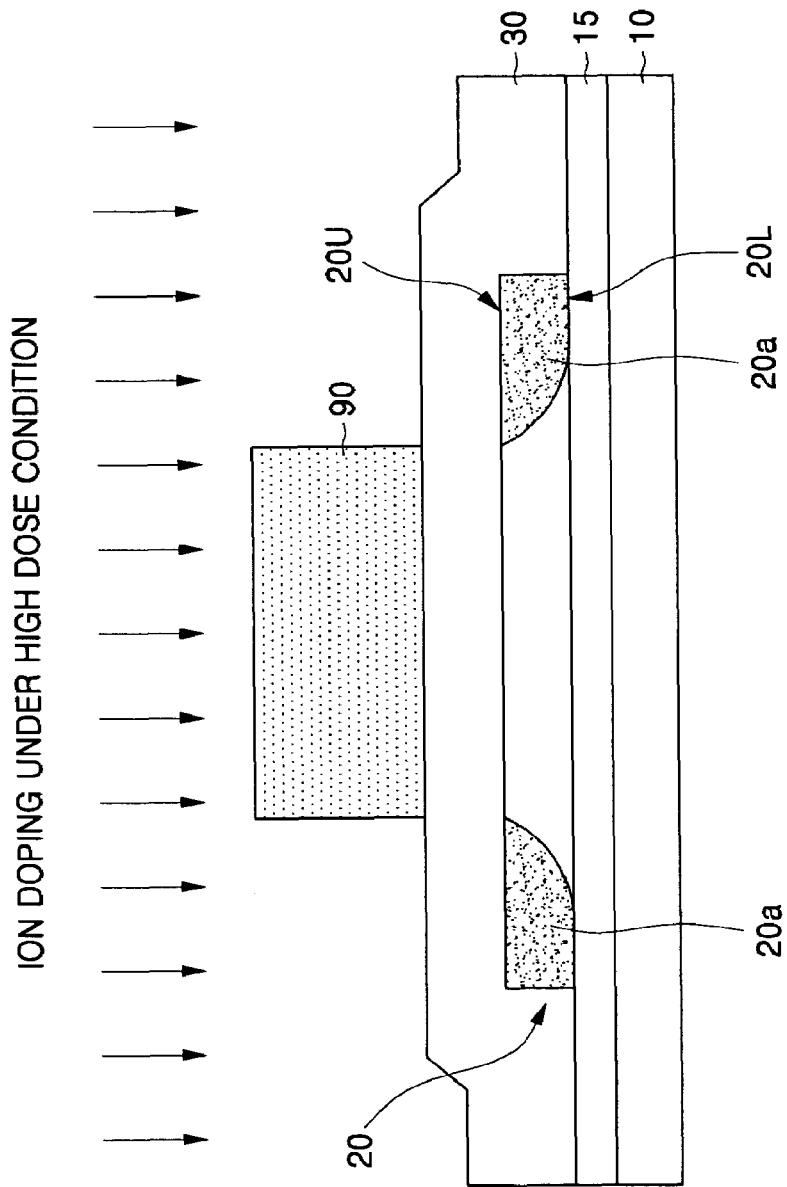

THIN FILM TRANSISTOR HAVING LDD STRUCTURE

CROSS REFERENCE TO RELATED APPLICATIONS

This application is a divisional of prior U.S. patent application Ser. No. 11/038,031, filed on Jan. 21, 2005, which claims priority to and the benefit of Korean Patent Application No. 10-2004-0009378, filed on Feb. 12, 2004, which are all hereby incorporated by reference for all purposes as if fully set forth herein.

BACKGROUND OF THE INVENTION

1. Field of the invention

The present invention relates to a thin film transistor (TFT), more particularly, to a TFT having a lightly doped drain (LDD) structure.

2. Discussion of the Background

Generally, a TFT comprises a semiconductor layer, a gate electrode and source/drain electrodes. The semiconductor layer comprises source/drain regions and a channel region interposed between the source/drain regions, and it may be formed of polycrystalline or amorphous silicon. Polycrystalline silicon is usually used since it has higher electron mobility than amorphous silicon.

However, a polycrystalline silicon TFT has a higher off current than an amorphous silicon TFT. Forming an LDD region between source/drain regions and the channel region of the polycrystalline silicon TFT may decrease its off current because the LDD region may prevent a rapid increase of electric field between the channel region and the source/drain regions. The LDD region may also suppress hot carrier effect (HCE) generated as the channel region's length decreases. Therefore, the LDD region may improve channel reliability.

In the LDD region, however, a profile of ions doped may have a considerable effect on a TFT's characteristics, including channel reliability.

SUMMARY OF THE INVENTION

The present invention provides a TFT in which electrical characteristics, including channel reliability, may be improved by optimizing a profile of ions doped in a LDD region.

Additional features of the invention will be set forth in the description which follows, and in part will be apparent from the description, or may be learned by practice of the invention.

The present invention discloses a TFT comprising a semiconductor layer including source/drain regions, a channel region positioned between the source/drain regions, and an LDD region positioned between the channel region and the source region or between the channel region and the drain region. A projected range of ions doped in the semiconductor layer extends to a first depth from a surface of the semiconductor layer in the LDD region.

The present invention also discloses a method for fabricating a TFT comprising forming a semiconductor layer on a substrate, forming a gate insulation layer on the semiconductor layer, forming a gate electrode on the gate insulation layer, and etching the gate insulation layer outside the perimeter of the gate electrode by as much as a first thickness. An LDD region is formed in which a projected range of ions doped in the semiconductor layer extends to a first depth from a surface of the semiconductor layer.

The present invention also discloses a method for forming a LDD region of a semiconductor layer, comprising controlling a depth of ion penetration in the LDD region by etching a layer before ion doping the semiconductor layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 1A and FIG. 1B are cross sectional views showing a TFT having an LDD structure and for describing a method for fabricating the same according to an exemplary embodiment of the present invention.

DETAILED DESCRIPTION OF THE ILLUSTRATED EMBODIMENTS

Figure 1B:
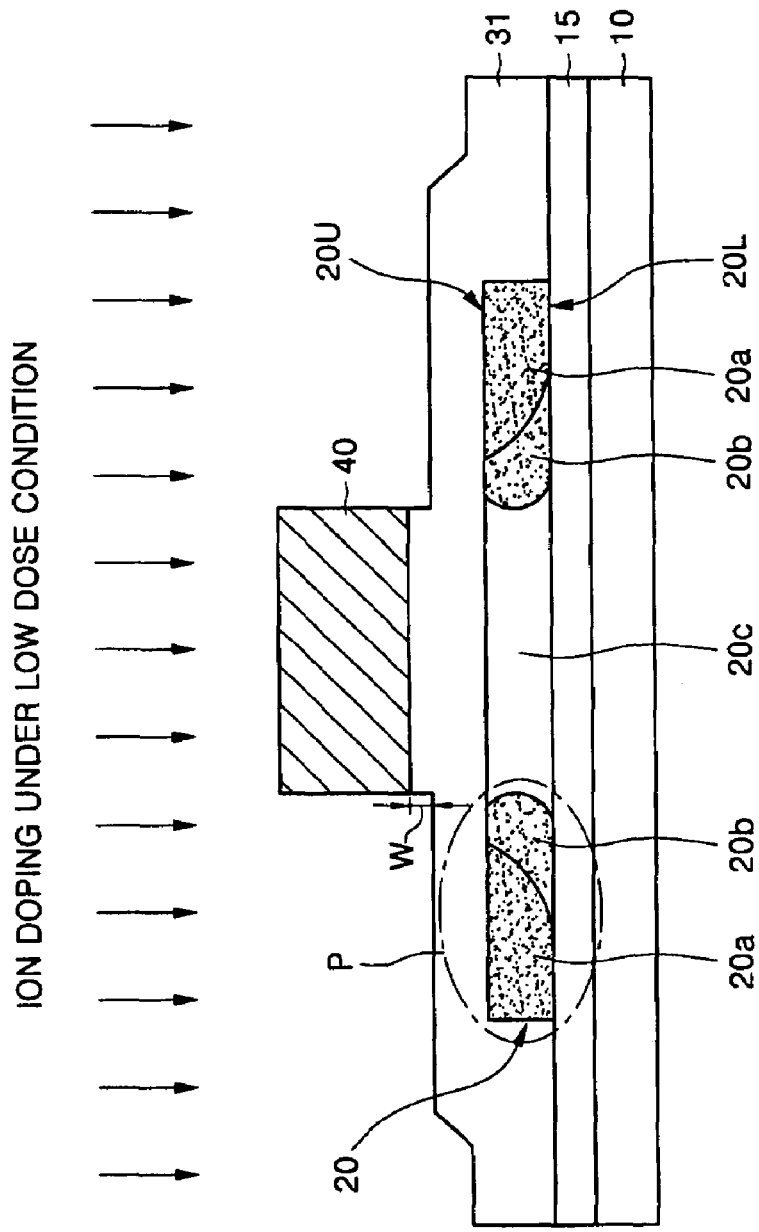

The present invention will now be described in detail in connection with exemplary embodiments with reference to the accompanying drawings. For reference, like reference characters designate corresponding parts throughout several views.

Figure 2:
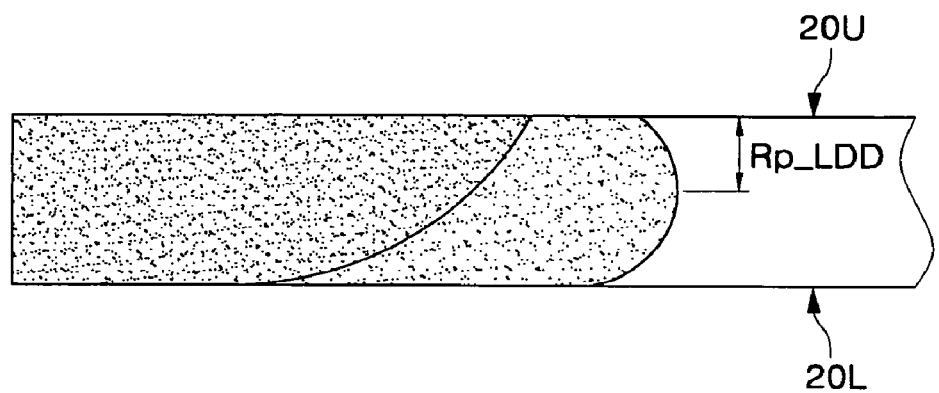
FIG. 2 is an expanded view of a region P in FIG. 1B.

FIG. 1A and FIG. 1B are cross sectional views showing a TFT having a LDD structure, and for describing a method for fabricating the same, according to an exemplary embodiment of the present invention. FIG. 2 is an expanded view showing a region P of FIG. 1B.

Referring to FIG. 1A, a buffer layer 15 may be formed on a substrate 10, which may be a glass or plastic substrate. The buffer layer 15, which may be formed of a silicon oxide film, silicon nitride film or silicon oxynitride film, protects a subsequently formed TFT from impurities in the substrate 10.

A semiconductor layer 20 is formed on the buffer layer 15. The semiconductor layer 20 may be formed of polycrystalline silicon film by crystallizing amorphous silicon film using an excimer laser annealing (ELA), sequential lateral solidification (SLS), metal induced crystallization (MIC), or metal induced lateral crystallization (MILC) method. The crystallization is preferably performed by the ELA or SLS method, which may be carried out at a relatively low temperature and with less contamination. However, the ELA or SLS method may leave the semiconductor layer 20 with a rough surface due to a surface protrusion part.

The semiconductor layer 20 may be about 500 to 600 Å thick in order to obtain satisfactory crystallization efficiency.

A gate insulation layer 30 may be formed on the semiconductor layer 20. The gate insulation layer 30 may be formed of silicon oxide film, silicon nitride film or double layers of the silicon oxide film and the silicon nitride film. The gate insulation layer 30 is preferably formed at a thickness capable of satisfying proper dielectric strength and threshold voltage of the TFT. Furthermore, the gate insulation layer 30 is preferably formed to cover a surface protrusion part of the semiconductor layer 20. If the gate insulation layer 30 does not completely cover the surface protrusion part of the semiconductor layer 20, a leakage current between the semiconductor layer 20 and a subsequently formed gate electrode may increase. Therefore, the gate insulation layer 30 may be about 500 to 1,000 Å thick.

A first photoresist pattern 90, shielding a central part of the semiconductor layer 20, may then be formed on the gate insulation layer 30. N-type or p-type ions may be doped under a high dose condition to a high concentration in the semiconductor layer 20, using the first photoresist pattern 90 as a mask, thereby forming source/drain regions 20a in the semiconductor layer 20. If doping n-type ions, the dose conditions may be about 8E14 to 1E15 ions/cm$^2$.

Ion doping may be performed under the accelerated voltage conditions of about 10 to 90 keV. It may be difficult to uniformly control the accelerated voltage over the substrate if it exceeds 90 keV, and it may be difficult to control the ion beam if the accelerated voltage is less than 10 keV. It may be preferable to perform ion doping under the accelerated voltage conditions of 80 keV or less to uniformly control the accelerated voltage over the substrate. Even if the ions are doped at about 90 keV, which is a maximum accelerated voltage, a projected range Rp of ions doped in the source/drain regions 20a may be positioned near an upper surface 20U of the semiconductor layer 20 because of the thickness of the gate insulation layer 30.

Referring to FIG. 1B and FIG. 2, the first photoresist pattern 90 of FIG. 1A is removed, and a gate conductive film is formed on a substrate 10 having the source/drain regions 20a. The gate conductive film may be formed of one metal selected from the group consisting of aluminum (Al), aluminum alloy (Al alloy), molybdenum (Mo) and molybdenum alloy (Mo alloy). More preferably, the gate conductive film may be formed of molybdenum-tungsten.

A second photoresist pattern (not shown), which is narrower than the first photoresist pattern 90, may be formed on the gate conductive film. The gate conductive film is then etched, using the second photoresist pattern as a mask, to form a gate electrode 40. The gate insulation layer 30 of FIG. 1A may then be etched as much as a first thickness W using the gate electrode 40 as a mask, thereby forming a gate insulation layer 31, etched as much as the first thickness W outside the perimeter of the gate electrode 40. The second photoresist pattern is then removed, and ions are doped under a low dose condition to a low concentration in the semiconductor layer 20, using the gate electrode 40 as a mask, thereby forming LDD region 20b, and defining channel region 20c, in the semiconductor layer 20. Consequently, the semiconductor layer 20 comprises the source/drain regions 20a, the channel region 20c, which is positioned between the source/drain regions 20a, and the LDD regions 20b, which are positioned between the channel region 20c and the source/drain regions 20a. The same conductive type of ions may be used to form the LDD regions 20b and the source/drain regions 20a. Additionally, the gate insulation layer 31 on the LDD regions 20b is thinner than the gate insulation layer 31 on channel region 20c. This difference in thickness may be as much as the first thickness W.

Doping ions to the low concentration does not mean absolute low concentration, but means a relatively lower concentration as compared with the high concentration. Therefore, the ion doping for forming the LDD regions 20b may be carried out under the dose conditions of 100 times or less as compared with the ion doping dose conditions for forming the source/drain regions 20a. Specifically, ion doping for forming the LDD regions 20b may be performed under the dose conditions of 1E13 to 5E13 ions/cm$^2$ if the ions are n-type ions.

The ion doping for forming the LDD regions 20b may be performed under the same accelerated voltage conditions as the ion doping for forming the source/drain regions 20a.

A projected range $Rp_{13}$ LDD of ions doped in the LDD region 20b extends to a point at a first depth from the surface of the semiconductor layer 20U. A range of ions doped in the LDD regions 20b differs from a range of ions doped in the source/drain regions 20a. This is because the ions for forming the LDD region 20b are doped in the semiconductor layer 20 through the thinner gate insulation layer 31, which is etched as much as the first thickness W. The first depth may equal the first thickness W. Therefore, adjusting the first thickness W may control the first depth. Although the first depth may preferably be half the thickness of the semiconductor layer 20, the first depth may satisfy the following mathematical expression considering an error during ion doping:

(thickness of the semiconductor layer/2)−100 Å≦first depth≦(thickness of the semiconductor layer/2)+ 100 Å                                <Mathematical Expression 1>

Therefore, a certain concentration or more of the ions doped in the LDD region 20b may be positioned near a lower surface 20L of the semiconductor layer 20, which may improve channel reliability.

Figure 3:
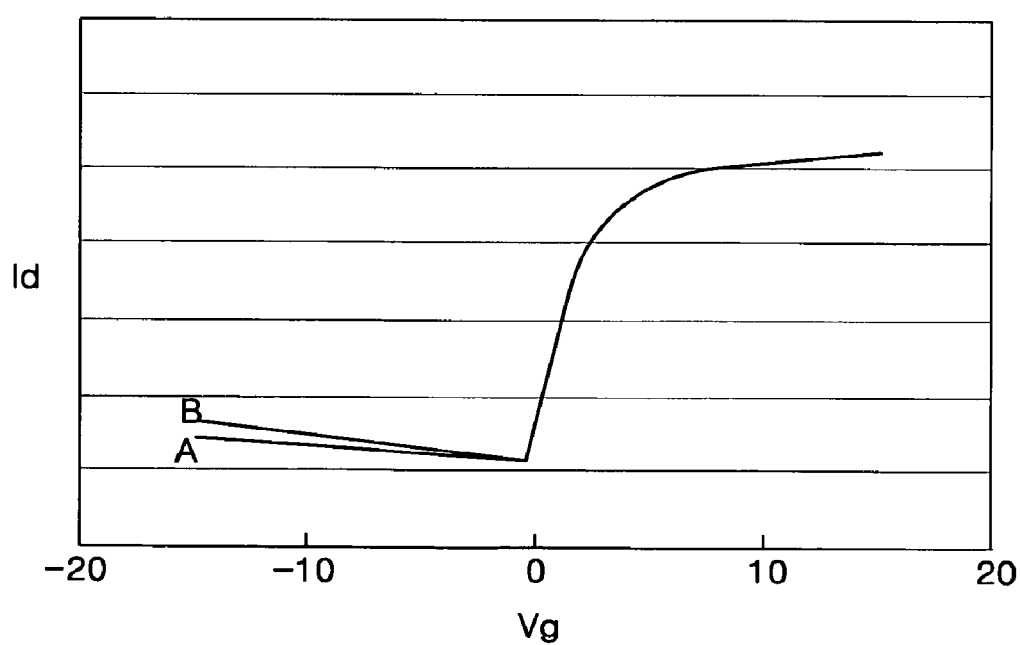
FIG. 3 is a graph showing TFT transfer characteristics.
Figure 4:
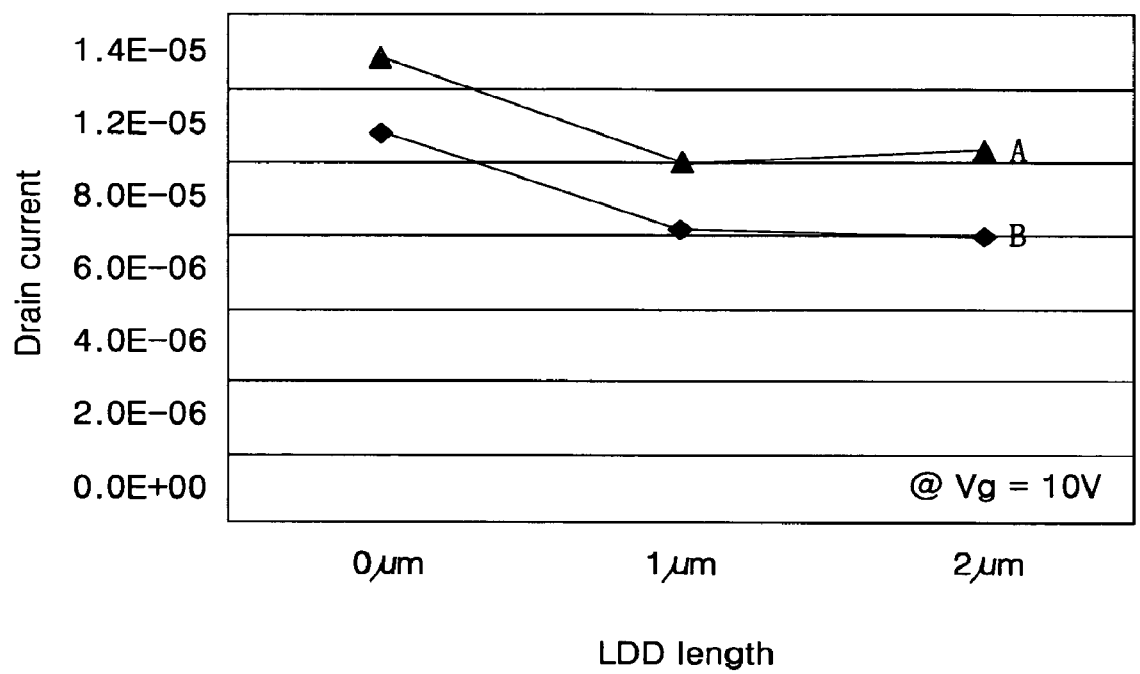
FIG. 4 is a graph showing TFT drain current characteristics with a 10 V gate voltage.

FIG. 3 is a graph showing TFT transfer characteristics, and FIG. 4 is a graph showing TFT drain current characteristics with a 10 V gate voltage. In FIG. 3 and FIG. 4, reference letter A indicates a first TFT A fabricated in such a manner that a projected range of ions doped in the LDD region extends to a central part of the semiconductor layer according to an exemplary embodiment of the present invention, and a reference letter B indicates a second TFT B fabricated in such a manner that a projected range of ions doped in the LDD region is positioned at an upper surface of the semiconductor layer.

Referring to FIG. 3, the first TFT A has a lower off current than the second TFT B.

Referring to FIG. 4, the first TFT A has a higher drain current (@ gate voltage Vg=10 V) than the second TFT B.

Therefore, the first TFT A according to an exemplary embodiment of the present invention may have improved channel reliability and output characteristics as compared with the second TFT B.

According to exemplary embodiments of the present invention, extending a projected range of ions doped in an LDD region to a central part of a semiconductor layer may improve a TFT's channel reliability and output characteristics.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a thin film transistor, comprising:

forming a semiconductor layer on a substrate;

forming a gate insulation layer on the semiconductor layer;

forming a gate electrode on the gate insulation layer;

etching an entire upper surface of the gate insulation layer except a portion on which the gate electrode is formed by as much as a first thickness; and forming a lightly doped drain (LDD) region in which a projected range of ions doped in the semiconductor layer extends to a first depth from a surface of the semiconductor layer, wherein the first thickness equals the first depth.

2. The method of claim 1, wherein the first depth satisfies the following mathematical expression:

$$\text{(thickness of the semiconductor layer}/2) - 100 \text{ Å} \leq \text{first depth} \leq \text{(thickness of the semiconductor layer}/2) + 100 \text{ Å}.$$

3. The method of claim 1, wherein ion doping for forming the LDD region is performed under accelerated voltage conditions in a range of about 80 to about 90 keV.

4. The method of claim 1, wherein ion doping for forming the LDD region is performed under dose conditions in a range of about 1E13 to about 5E13 ions/cm2.

5. The method of claim 1, wherein the portion of the gate insulation layer on which the gate electrode is formed has a second thickness before and after the gate insulation layer is etched, and a portion of the gate insulation layer on which the gate electrode is not formed has the second thickness before being etched and a third thickness after being etched, the difference between the second thickness and the third thickness equaling the first thickness.

* * * * *

UNITED STATES PATENT AND TRADEMARK OFFICE
CERTIFICATE OF CORRECTION

PATENT NO. : 7,491,591 B2  Page 1 of 1
APPLICATION NO. : 11/768332
DATED : February 17, 2009
INVENTOR(S) : Kyu-Hwan Choi It is certified that error appears in the above-identified patent and that said Letters Patent is hereby corrected as shown below:

On the Title Page, in section [73] Assignee, "Samsung SDI Co., Ltd." should be changed to --Samsung Mobile Display Co., Ltd.--

Signed and Sealed this

First Day of June, 2010

David J. Kappos
*Director of the United States Patent and Trademark Office*